US008238477B2

(12) United States Patent
Zocher et al.

(10) Patent No.: US 8,238,477 B2

(45) Date of Patent: Aug. 7, 2012

(54) DATA SLICER WITH MULTI-MODE THRESHOLD GENERATOR

(75) Inventors: Andrew Zocher, Monticello, IL (US); Luiz Antonio Razera, Jr., San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 588 days.

(21) Appl. No.: 12/396,422

(22) Filed: Mar. 2, 2009

(65) Prior Publication Data

US 2010/0220817 A1 Sep. 2, 2010

(51) Int. Cl.
*H04L 25/06* (2006.01)

(52) U.S. Cl. ........ 375/317; 375/316; 375/324; 375/326; 375/340; 327/1; 327/28; 327/30; 327/50; 327/56; 327/58; 327/62; 327/80

(58) Field of Classification Search .................. 375/316, 375/317, 324, 326, 340; 327/1, 28, 30, 50, 327/56, 58, 62, 80
See application file for complete search history.

(56) References Cited

U.S. PATENT DOCUMENTS 6,735,260 B1 * 5/2004 Eliezer et al. ................ 375/316

* cited by examiner

*Primary Examiner* — Leon Flores
(74) *Attorney, Agent, or Firm* — TIPS Group

(57) ABSTRACT

In an embodiment, set forth by way of example and not limitation, a data slicer includes a signal input node, a comparator having a first input of a first polarity, a second input of a second polarity which is the opposite of the first polarity, and an output coupled to a data out node, the first input of the comparator being coupled to the signal input node, and a multi-mode threshold generator including a first threshold generator and second threshold generator, whereby the first threshold generator is selected firstly and the second threshold generator is selected secondly.

17 Claims, 8 Drawing Sheets

| DR NRZ (kHz) | DR Manch (kHz) | Cext (nF) | Rtg (kΩ) | f3dB (kHz) | Trc /Td | Code3 | Code2 | Code1 | Code0 | Code | s0 | s1 | s2 | s3 | s4 | s5 | s6 | s7 | s8 | s9 |
|---|---|---|---|---|---|---|---|---|---|---|---|---|---|---|---|---|---|---|---|---|
| 1.0 | 0.5 | 22 | 700 | 0.01 | 8 | 0 | 0 | 0 | 0 | 0 | | 1 | 1 | | | | | | | |
| 2 | 1 | 22 | 350 | 0.02 | 8 | 0 | 0 | 0 | 1 | 1 | | 1 | | 1 | | | | | | |
| 4 | 2 | 22 | 175 | 0.04 | 8 | 0 | 0 | 1 | 0 | 2 | 1 | | 1 | | | | | | | |
| 8 | 4 | 22 | 88 | 0.08 | 8 | 0 | 0 | 1 | 1 | 3 | 1 | | 1 | 1 | | | | | | |
| 16 | 8 | 22 | 44 | 0.17 | 8 | 0 | 1 | 0 | 0 | 4 | | | | | | 1 | 1 | | | |
| 32 | 16 | 22 | 22 | 0.33 | 8 | 0 | 1 | 0 | 1 | 5 | | | | | | 1 | | 1 | | |
| 64 | 32 | 22 | 11 | 0.66 | 8 | 0 | 1 | 1 | 0 | 6 | | | | | 1 | 1 | | 1 | | |
| 128 | 64 | 22 | 5.5 | 1.32 | 8 | 0 | 1 | 1 | 1 | 7 | | | | | | | | | 1 | |
| 256 | 128 | 22 | 2.7 | 2.65 | 8 | 1 | 0 | 0 | 0 | 8 | | | | | | | | | 1 | 1 |
| 256 | 128 | 22 | 2.7 | 2.65 | 8 | 1 | 0 | 0 | 1 | 9 | | | | | | | | | 1 | 1 |
| 256 | 128 | 22 | 2.7 | 2.65 | 8 | 1 | 0 | 1 | 0 | A | | | | | | | | | 1 | 1 |
| 256 | 128 | 22 | 2.7 | 2.65 | 8 | 1 | 0 | 1 | 1 | B | | | | | | | | | 1 | 1 |
| 256 | 128 | 22 | 2.7 | 2.65 | 8 | 1 | 1 | 0 | 0 | C | | | | | | | | | 1 | 1 |
| 256 | 128 | 22 | 2.7 | 2.65 | 8 | 1 | 1 | 0 | 1 | D | | | | | | | | | 1 | 1 |
| 256 | 128 | 22 | 2.7 | 2.65 | 8 | 1 | 1 | 1 | 0 | E | | | | | | | | | 1 | 1 |
| 256 | 128 | 22 | 2.7 | 2.65 | 8 | 1 | 1 | 1 | 1 | F | | | | | | | | | 1 | 1 |

FIG. 7

DATA SLICER WITH MULTI-MODE THRESHOLD GENERATOR

CROSS REFERENCE TO RELATED APPLICATIONS

This application is related to U.S. Ser. No. 12/396,425 filed concurrently herewith and U.S. Ser. No. 12/396,421 filed concurrently herewith, both of which are incorporated herein by reference.

BACKGROUND

Automatic gain control (AGC) is an adaptive system found in many electronic devices. Typically, the average output signal level is fed back to adjust the gain to an appropriate level for a range of input signal levels. AGC has been long-applied in receiver technologies.

For example, without AGC the sound emitted from an amplitude modulated (AM) receiver would vary to an extreme extent from a weak to a strong signal. The AGC effectively reduces the volume if the signal is strong and raises it when it is weaker. AGC technologies can also be applied, for example, to frequency modulated (FM) receivers and phase modulated (PM) receivers.

Digital receivers are designed to detect and amplify digitally encoded signals. Such receivers may also be paired with digital transmitters to form digital transceivers. In some instances, the digital receivers can be multi-mode, such as digital AM receivers and digital FM receivers. Various AGC systems have been designed for such digital receivers.

Since AGCs operate by feeding back some of the output of a stage to control the gain, they are often referred to as having "AGC loops." AGCs are of three general types: 1) all-digital; 2) analog; and 3) mixed-mode including both digital and analog components.

The output of digital receivers is typically not ready to be input into a digital processing device such as a microprocessor. The output must be first digitized in a digitizer stage. A common form of digitizer is known as a "data slicer." A data slicer works, in a way, like the demodulator portion of a modem. That is, a data slicer takes audio signals derived from a radio signal and converts them into digital bits (i.e. an analog to digital conversion). A stream of these digital bits, often arranged as "words", can be input into a processor for digital processing. Data slicers decode FSK (Frequency Shift Keying) signals and ASK (Amplitude Shift Keying) signals.

In U.S. Pat. No. 5,933,455 of Hendrickson et al. an adaptive R/C circuit to improve threshold attack time is described. While accurate, adaptive R/C circuits have a rather slow acquisition time, resulting in possible data loss.

In U.S. Pat. No. 6,680,984 of Teghararian et al. a mixed-mode threshold generator is described that allows the receiver to be disabled and re-enabled while maintaining a proper slicing threshold during the sleep interval. However, the design requires a complex and expensive mixed-mode loop to preserve the proper slicing threshold during a sleep cycle.

In U.S. Pat. No. 6,735,260 Elizer et al. describe a threshold generator that uses dual peak detectors with an adaptable time constant to improve acquisition time. The peak detectors remain on after acquisition, resulting in a continuous current drain and the addition of noise to the output signal. U.S. Pat. No. 7,266,163 of Khorram et al. discuss a similar adaptive threshold generator.

These and other limitations of the prior art will become apparent to those of skill in the art upon a reading of the following descriptions and a study of the several figures of the drawing.

SUMMARY

In an embodiment, set forth by way of example and not limitation, a data slicer includes a signal input node, a comparator having a first input of a first polarity, a second input of a second polarity which is the opposite of the first polarity, and an output coupled to a data out node, the first input of the comparator being coupled to the signal input node, and a multi-mode threshold generator including a first threshold generator and second threshold generator, whereby the first threshold generator is selected firstly and the second threshold generator is selected secondly.

In an embodiment, set forth by way of example and not limitation, a multi-mode threshold generator includes a first threshold generator having a first attack time after a reset and a first SNR ratio during operation, a second threshold generator having a second attack time after a reset a second SNR during operation, where the second attack time is greater than the first attack time and the second SNR is greater than the first SNR, and circuitry firstly selecting the first threshold generator and then secondly selecting the second threshold generator.

In an example embodiment, the first threshold detector is a dual peak detector circuit and the second threshold detector is an R/C circuit. In another example embodiment, the circuitry includes a plurality of switches under digital processor control. In another example embodiment, at least one resistor of the first threshold detector and the second threshold detector is tunable under digital processor control to a plurality of resistances levels.

In an embodiment, set forth by way of example and not limitation, a method for controlling a multi-mode threshold generator includes resetting a first threshold generator and a second threshold generator, first enabling the first threshold generator for operation, and second enabling the second threshold generator for operation.

Example embodiments advantageously utilize low-leakage external capacitors to preserve the proper slicing threshold during a sleep cycle, unlike the mixed-mode threshold generators of the prior art which rely on a complex and expensive mixed-mode loops.

Further, example embodiments disclosed herein consume less current and produce less noise than threshold generators of the prior art which utilize dual peak detectors with an adaptable time constant to improve acquisition time but which leave the peak detectors on after acquisition.

The example embodiments disclosed herein offer the benefits of fast-attack and low noise/low-current, and represent a significant advance over the prior art. It is important to note that fast receiver warm-up time and good receiver sensitivity are both highly desirable characteristics which heretofore were not available in one integrated threshold generator solution. The example embodiments disclosed herein offer the best of both worlds.

These and other embodiments and advantages and other features disclosed herein will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following example figures:

FIG. 7 is a truth table, set forth by way of example and not limitation, for the tunable resistor embodiment of claim 6.

DETAILED DESCRIPTION OF EXAMPLE EMBODIMENTS

Figure 1:
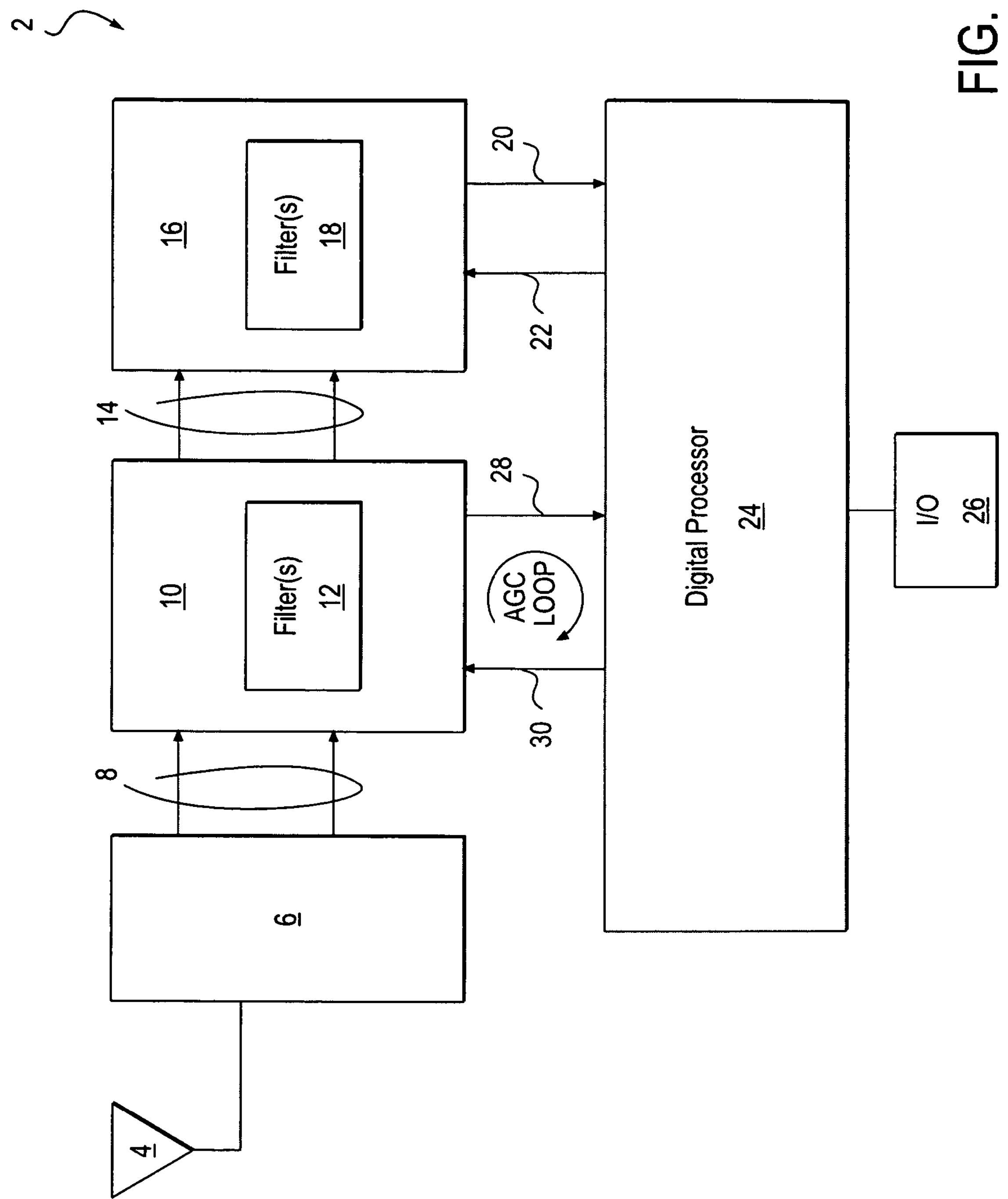
FIG. 1 is a block diagram of an example receiver with automatic gain control.

FIG. 1 is a block diagram illustrating a digital receiver system 2, set forth by way of example and not limitation. In this example, the digital receiver system 2 has an antenna 4 coupled to an antenna matching stage 6. Antenna matching stage 6 is coupled via a modulated signal input 8 to an AGC receiver 10. Antenna matching stage 6 typically comprises a network which matches the impedance of antenna 4 to the AGC receiver 10, as will be appreciated by those of skill in the art.

AGC receiver 10 includes circuitry to amplify and demodulate the signal received at modulated signal input 8. In certain example embodiments, the AGC receiver 10 includes one or more configurable filter(s) 12. AGC receiver 10 is coupled via signal output 14 to a digitization stage 16 which receives the demodulated signal and converts it to a digital waveform. In certain example embodiments, digitization stage 16 includes one or more configurable filter(s) 18.

Digitization stage 16 is coupled via digital signal output 20 to an input of digital processor 24. Digital processor 24 has a number of outputs 22 coupled to a control input of the digitization stage 16.

Digital processor 24 receives and post-processes the digital signal received via digital signal output 20. Digital processor is typically a microprocessor but may, in certain embodiments, be implemented otherwise. By way of non-limiting example, digital processor may be a state machine implemented by any number of well known technologies such as programmable gate arrays or a customized integrated circuit.

Digital processor 24 is coupled to I/O stage 26 which is used for various digital inputs and outputs including, without limitation, the output of the digital signal and external programmability of receiver with automatic gain control 2. In certain non-limiting example embodiments I/O stage 26 includes a serial peripheral interface (SPI).

In this example embodiment, digital processor 28 has a waveform input 28 coupled to the AGC which, in combination with the current gain setting, can be used to calculate a new gain setting. The gain setting, in this example, is provided as a digital word via AGC control output 30 which couples digital processor 28 to AGC receiver 10. AGC receiver 10 applies the gain setting received from AGC control output 30 to the modulated signal obtained from modulated signal input 8.

Figure 2:
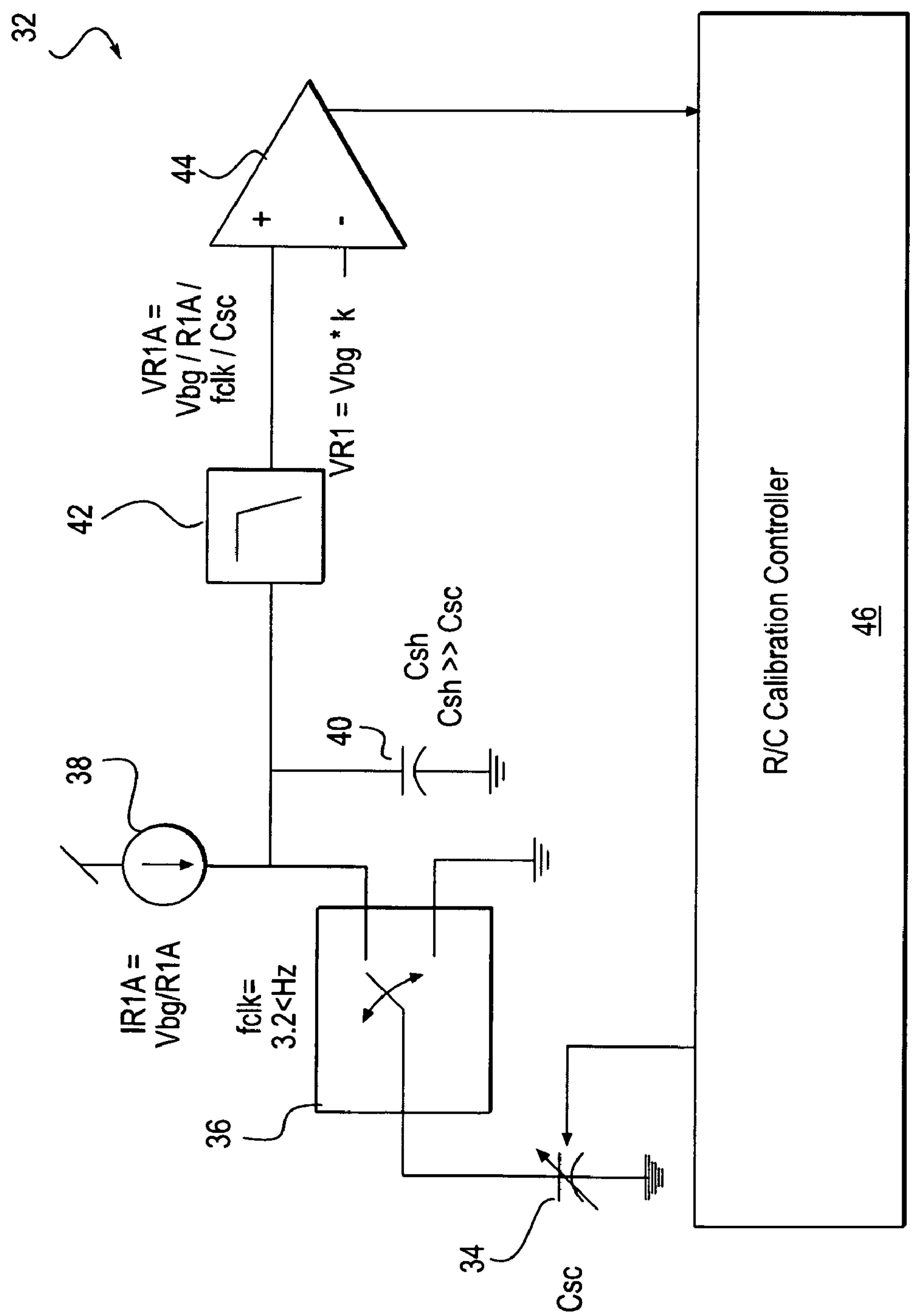
FIG. 2 is a block diagram of an example R/C calibration controller for filters, such as filters used in the example receiver of FIG. 1.

As will be appreciated by those of skill in the art, proper operation of digital receiver system 2 depends upon the correct calibration of various filters such as AGC receiver filter(s) 12 and digitization stage filter(s) 18. The manner in which the calibrations are performed may be chosen from a wide variety of methods known to those of skill in the art. FIG. 2 is a schematic diagram describing an example R/C time constant calibration circuit which has been found to be useful in certain example embodiments.

Example calibration circuit 32 as shown in FIG. 2 includes a switched capacitor (Csc) 34, a clock 36, a current source 38, a capacitor (Csh) 40, a low pass filter 42, a comparator 44 and an R/C calibration controller 46. It will be appreciated that the calibration circuit 32 operates as what is essentially a proxy oscillator; however the nature of this circuit is that it does not require a phase locked loop that certain other proxy oscillators use. As will be further appreciated by those skilled in the art, the voltage at capacitor 34 is known, because the current going into that node on the positive side of the capacitor is known, as is the clock frequency, and the value of the capacitor. As the switched capacitor 34 is charging and discharging, some residue associated with the clock is generated and capacitor 40 performs filtering on the clock residue. In addition, the filter 42 being calibrated is used, but at a frequency that is well below its cut-off frequency, such that the output of the filter is essentially a DC voltage.

A SAR algorithm embodied in the R/C calibration controller manipulates the switched capacitor 34 until the two D.C. voltages at the input of the comparator 44 converge. Once the D.C. values of the comparator 44 have converged, the R/C time constant is calibrated to within the ability to "tune" the switched capacitor 34. The SAR controller manipulates the capacitor code until:

$$VR1A=CR1$$

$$R1A*Csc=1/fclk/k$$

$RC$ time constant is stable

An advantage of using this example approach is that it performs the desired calibration with minimal hardware, and thus a low-cost solution is provided. Further reduction of cost can be achieved by "borrowing" components from other portions of the receiver with automatic gain control 2 which are not in use at calibration time. For example, a sample and hold capacitor associated with an analog-to-digital converter (ADC) may be used for capacitor 40. Such "borrowing" can be achieved by isolating said components from the any other circuits using switches, as is well known to those skilled in the art.

Figure 3:
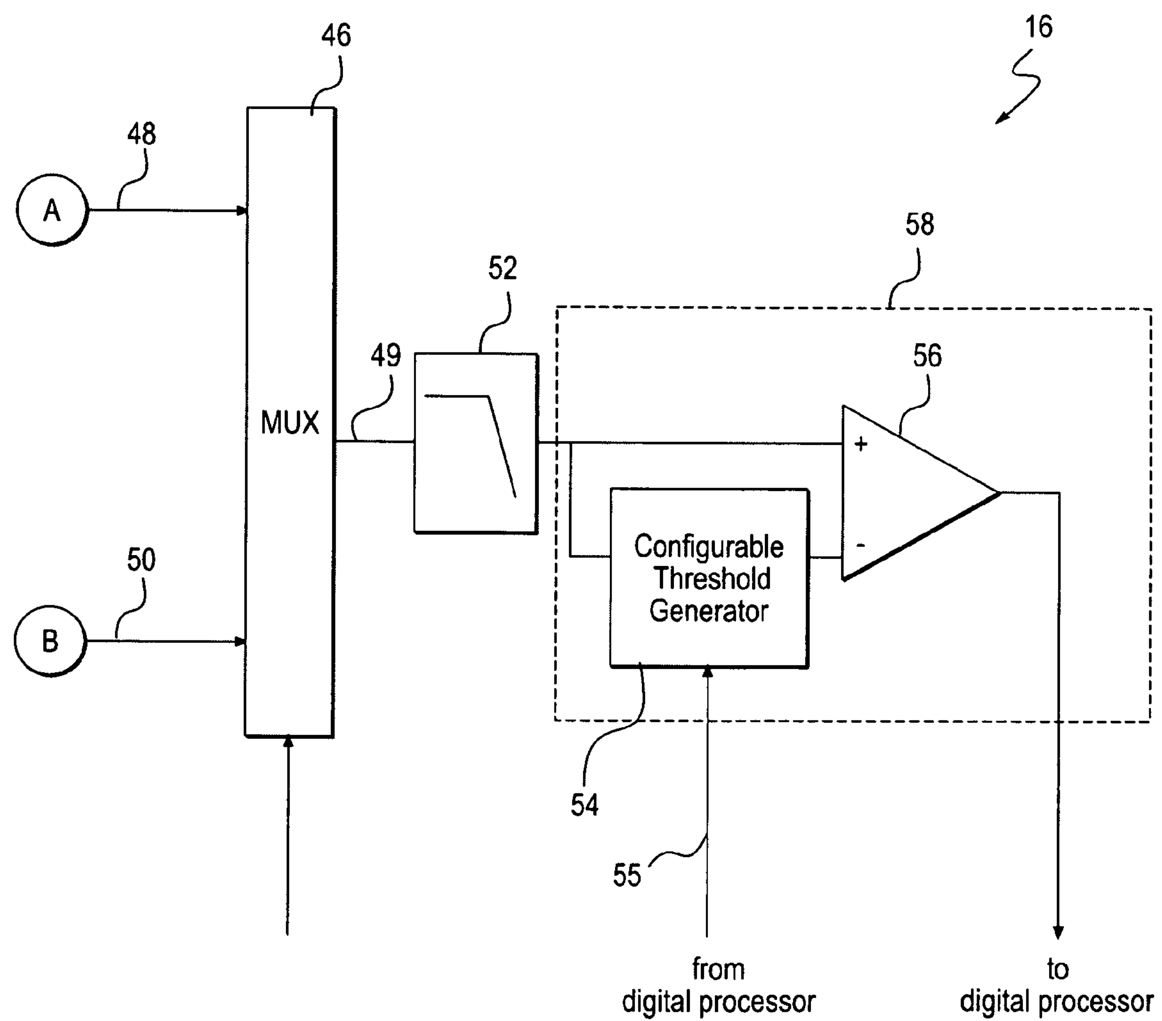
FIG. 3 is block diagram of a data slicer embodiment, set forth by way of example and not limitation.

FIG. 3 is a block diagram of an example digitization stage 16 of FIG. 1. Digitization stage 16, in this non-limiting example, includes a MUX 46, an input 48 of which is coupled to node A (see FIG. 1) which provides a demodulated frequency shift keyed ("FSK") signal. Another input 50 of MUX 46 is coupled to node B (see, again, FIG. 1) which provides a demodulated amplitude shift keyed ("ASK") signal. MUX 46 is preferably also coupled to a control input CNTR which is used to control the MUX. Control of MUX 46 can be handled, for example, by digital processor 24 of FIG. 1 or other digital logic as will be appreciated by those of skill in the art.

Digitization stage 16 further includes a low pass filter 52, an input of which is coupled to an output 49 of MUX 46. Low-pass filter 52 filters noise associated with rectification or frequency shift keyed demodulation, as well as noise associated with RF reception, as will be appreciated by those skilled in the art.

Digitization stage 16 further includes configurable multi-mode threshold generator 54, an input of which is coupled to an output of low pass filter 52. A control input 55 of configurable multi-mode threshold generator 54 may be coupled, by way of non-limiting example, to digital processor 24 of FIG. 1. Under the control of digital processor 24 of FIG. 1, configurable multi-mode threshold generator 54 derives a slicer threshold signal.

Digitization stage 16 further includes a comparator 56, a positive ("+") input of which is coupled to an output of low pass filter 52, and a negative ("−") input of which is coupled to an output of configurable multi-mode threshold generator 54 from which it obtains a slicer threshold signal.

As will be apparent to persons of skill in the art, comparator 56 digitizes the input signal obtained from low pass filter 52 based on the slicer threshold signal obtained from configurable multi-mode threshold generator 54. Comparator 56 provides a digital output which is coupled to, by way of a non-limiting example, an input of digital processor 24 of FIG. 1. Persons of skill in the art will recognize that configurable multi-mode threshold generator 54 together with the comparator include a data slicer 58. In certain example embodiments, a digital processor may post-processes the digital signal based on, by way of a non-limiting example, known timing characteristics of the input signal.

Figure 4:
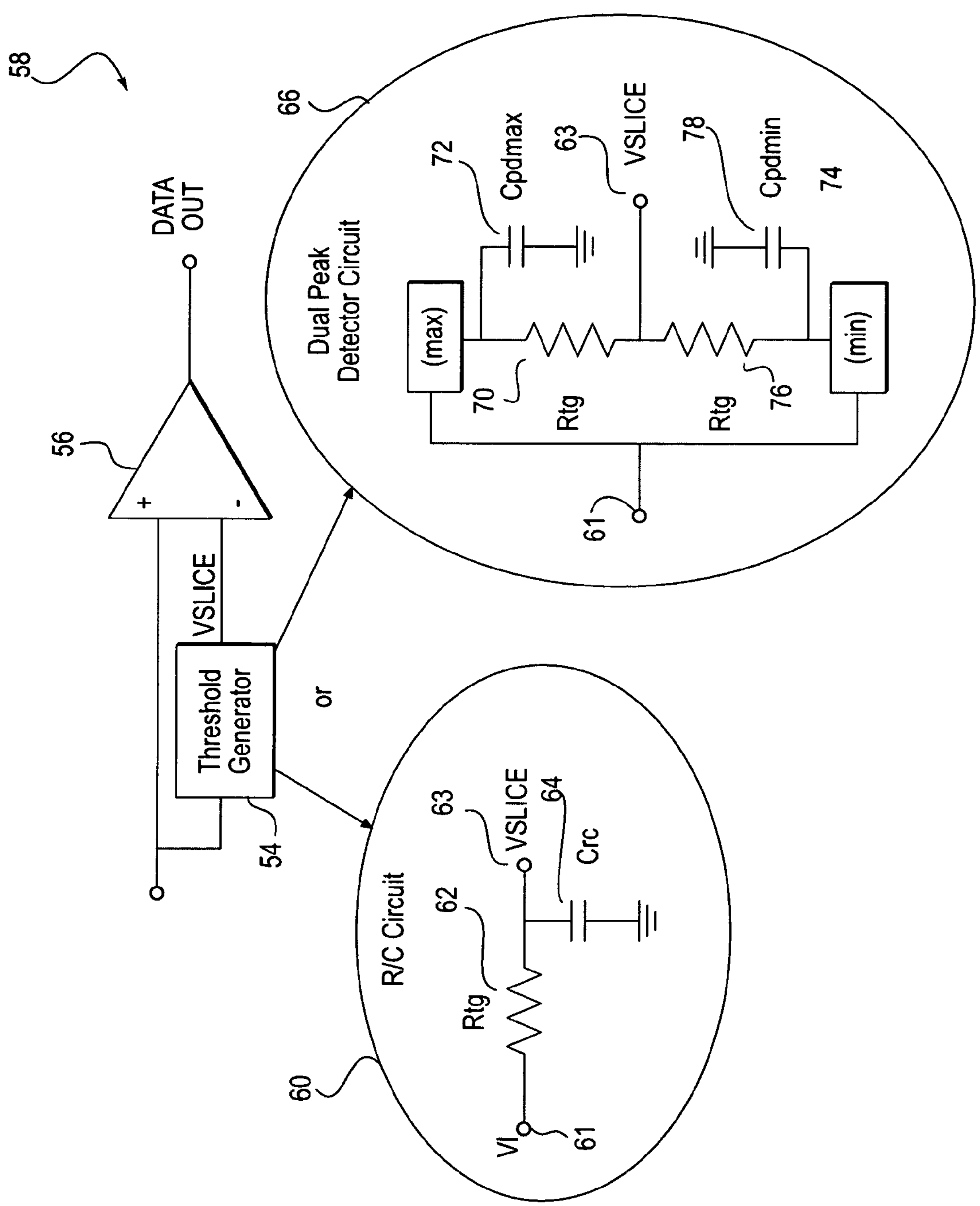
FIG. 4 is block diagram and schematic of a data slicer embodiment, set forth by way of example and not limitation.

FIG. 4 is a block diagram depicting an example data slicer 58 of FIG. 3, including breakouts of example components of a multi-mode threshold generator 54. In this example, configurable multi-mode threshold generator 54 includes an R/C Circuit 60 and a Dual Peak Detector Circuit 66.

Example R/C circuit 60, as will be appreciated by those skilled in the art, will produce a slicer threshold signal VSLICE with a very low signal to noise ratio (SNR). R/C circuit 60 includes a resistor 62 ("Rtg") and a capacitor 64 ("Crc"). Resistor 62 is coupled between an input node 61 ("VI") and an output node 63 ("VSLICE"). Capacitor 64 is coupled between node 63 and ground. Persons of skill in the art will appreciate that R/C capacitor 64 should be charged over a period of time before R/C Circuit 60 can properly perform its function.

Data slicer 58 further includes dual peak detector circuit 66 which, like R/C circuit 60, develops a slicer threshold signal at an output node 63 based on an input signal at node 61. Persons of skill in the art will recognize that dual peak detector circuit 66 will acquire a threshold very quickly, although its signal to noise ratio (SNR) is somewhat diminished as compared to that of R/C circuit 60. Dual peak detector circuit 66 includes a maximum peak detector 68 ("max"), an input of which is coupled to input node 61. Dual peak detector circuit 66 further includes a resistor 70 ("Rtg") which is coupled between the output of maximum peak detector 68 and node 63. A capacitor 72 ("Cpdmax") is coupled between the output of maximum peak detector 68 and ground.

Dual peak detector circuit 66 further includes a minimum peak detector 74 ("min"), an input of which is coupled to input node 61. Dual peak detector circuit 66 further includes a resistor 76 ("Rtg") which is coupled between an output of minimum peak detector 74 and node 63. A capacitor 78 ("Cpdmin") is coupled between the output of minimum peak detector 74 and ground.

As will be appreciated by those of skill in the art, both R/C Circuit threshold generators and Dual Peak Detector Circuit threshold generators have their pros and cons. Advantageously, in an embodiment set forth by way of example and not limitation, a configurable multi-mode threshold generator 54 is provided which has low-cost, low-noise, low current consumption and fast-attack characteristics by combining two or more threshold generator types (e.g. the R/C Circuit threshold generator and a Dual Peak Detector Circuit threshold generator in this example) and controlling the multiple threshold generators with digital logic.

Figure 5:
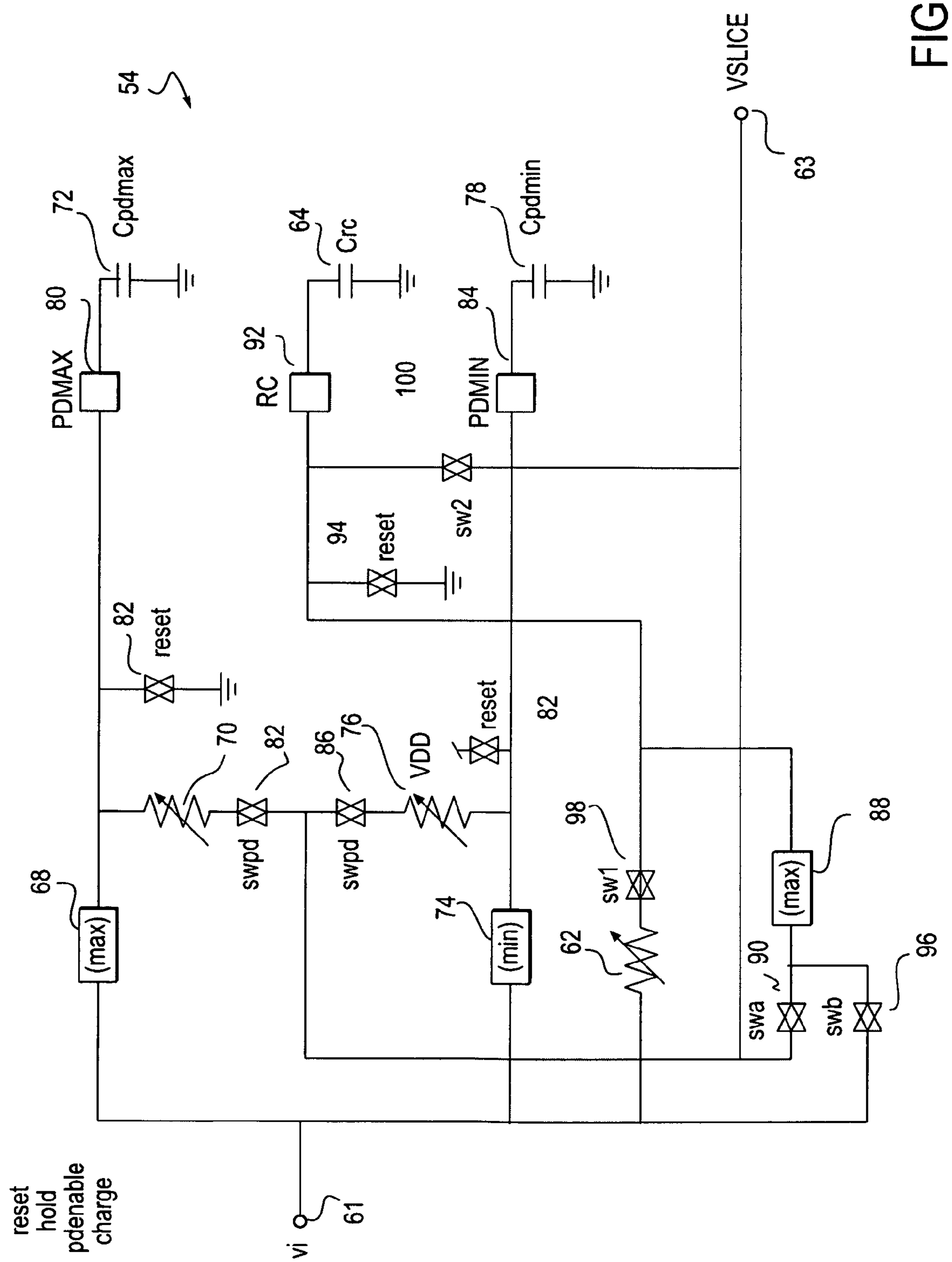
FIG. 5 is a block diagram and schematic of a configurable threshold generator embodiment, set forth by way of example and not limitation.

In the schematic diagram of FIG. 5, an example configurable multi-mode threshold generator 54 will be discussed where reference numerals and other labels correspond to like reference numerals and other labels of FIG. 4. Generator 54 includes maximum peak detector 68, an input of which is coupled to input node 61, and an output of which is coupled to a pad 80 ("PDMAX"). An external capacitor 72 ("Cpdmax") is operationally coupled between pad 80 and ground. Digital switch 82 grounds the capacitor 72 when it is closed during a reset operation.

Configurable multi-mode threshold generator 54 further includes, in this example, a tunable resistor 70, which according to certain embodiments includes a configurable resistor network. Resistor 70 is coupled between an output of peak detector 68 and a digital switch 82 ("swpd") which, when closed, couples resistor 70 to output node 63.

Configurable multi-mode threshold generator 54 further includes a minimum peak detector 74, an input of which is coupled to input node 61, and an output of which is coupled to pad 84 ("PDMIN"). An external capacitor 78 ("Cpdmin") is operationally coupled between pad 84 and ground. Digital switch 82 can be closed to charge capacitor 78 by coupling it to VDD.

Configurable multi-mode threshold generator 54 further includes a tunable resistor 76, which according to certain example embodiments includes a configurable resistor network. Resistor 76 is coupled between an output of minimum peak detector 74 and a digital switch 86 ("swpd") which, when closed, couples resistor 76 to output node 63.

Configurable multi-mode threshold generator 54 further includes a maximum peak detector 88, which is coupled via a digital switch 90 ("swa") to the output node 63. When switch 90 is closed, maximum peak detector 88 is disposed to charge external capacitor 64 to which it is operationally coupled. A digital switch 94, when closed, couples capacitor 64 to ground to discharge the capacitor during a reset cycle. An input of maximum peak detector 88 is coupled to input node 61 via a digital switch 96 ("swb").

Configurable multi-mode threshold generator 54 further includes tunable resistor 62 which, according to certain example embodiments, includes a configurable resistor network. Resistor 62 is coupled between input 61 and a digital switch ("sw1") which selectively couples it to capacitor 64. Configurable multi-mode threshold generator 54 further includes a digital switch 100 ("sw2") which is coupled between output node 63 and capacitor 64.

Persons of skill in the art will appreciate that example multi-mode threshold generator 54 can be configured for various modes of operation. The following modes of operation, set forth by way of example and not limitation, illustrate the configurable nature of example multi-mode threshold generator 54.

Example operating mode 1 features the fast-attack capabilities of the peak detectors along with the low-noise and low-current characteristics of the R/C averaging circuit. Example operating mode 2 features a fast attack to the maximum value of the data waveform, but it then exhibits a slow decay to the optimum threshold. Example operating mode 3 features the fast-attack capabilities of the peak detectors, but the peak detectors continue to draw current and add noise throughout the data demodulation interval. Example operating mode 4 features the low-noise and low-current characteristics of the R/C averaging circuit, but the settling time to the optimum threshold can be significant.

In example operating mode 1, the threshold generator is held in reset mode until the AGC loop has settled. Once the loop has settled, the dual (max & min) peak detectors are enabled and they remain on for a programmable interval, since the peak detector acquisition time depends on both the peak detector charge/discharge time and the data rate. Once the peak detectors have acquired the desired threshold level, another peak detector is enabled that charges Crc, the capacitor associated with the R/C threshold generator. After Crc is charged, all peak detectors are disabled and the threshold generator reverts to R/C mode in order to save current and to reduce noise. Operating mode 1 is the most desirable mode for fast threshold acquisition and for low-noise and low current drain after initial threshold acquisition.

In operating mode 2, the threshold generator is held in reset mode until the AGC loop has settled. Once the loop has settled, the R/C peak detector is enabled for 20 microseconds and then released.

In operating mode 3, the threshold generator is held in reset mode until the AGC loop has settled. Once the loop has settled, the positive and negative peak detectors are enabled and they remain on throughout the data demodulation interval.

In operating mode 4, the threshold generator is held in reset mode until the AGC loop has settled. Once the loop has settled, the R/C averaging circuit is activated.

In addition to these modes of operation, example configurable multi-mode threshold generator 54 features a mode in which all three capacitors (Cpdmax, Cpdmin and Crc) are tristated. In this fifth example mode, the charge is held on these capacitors so that the receiver can be disabled and enabled again while maintaining the proper slicing threshold during the sleep interval.

As noted, example embodiments disclosed herein advantageously utilize low-leakage external capacitors (e.g. capacitors 72, 64, 78) to preserve the proper slicing threshold during a sleep cycle. Further, example embodiments disclosed herein consume less current and produce less noise than threshold generators of the prior art which utilize dual peak detectors with an adaptable time constant to improve acquisition time but which leave the peak detectors on after acquisition.

Figure 6:
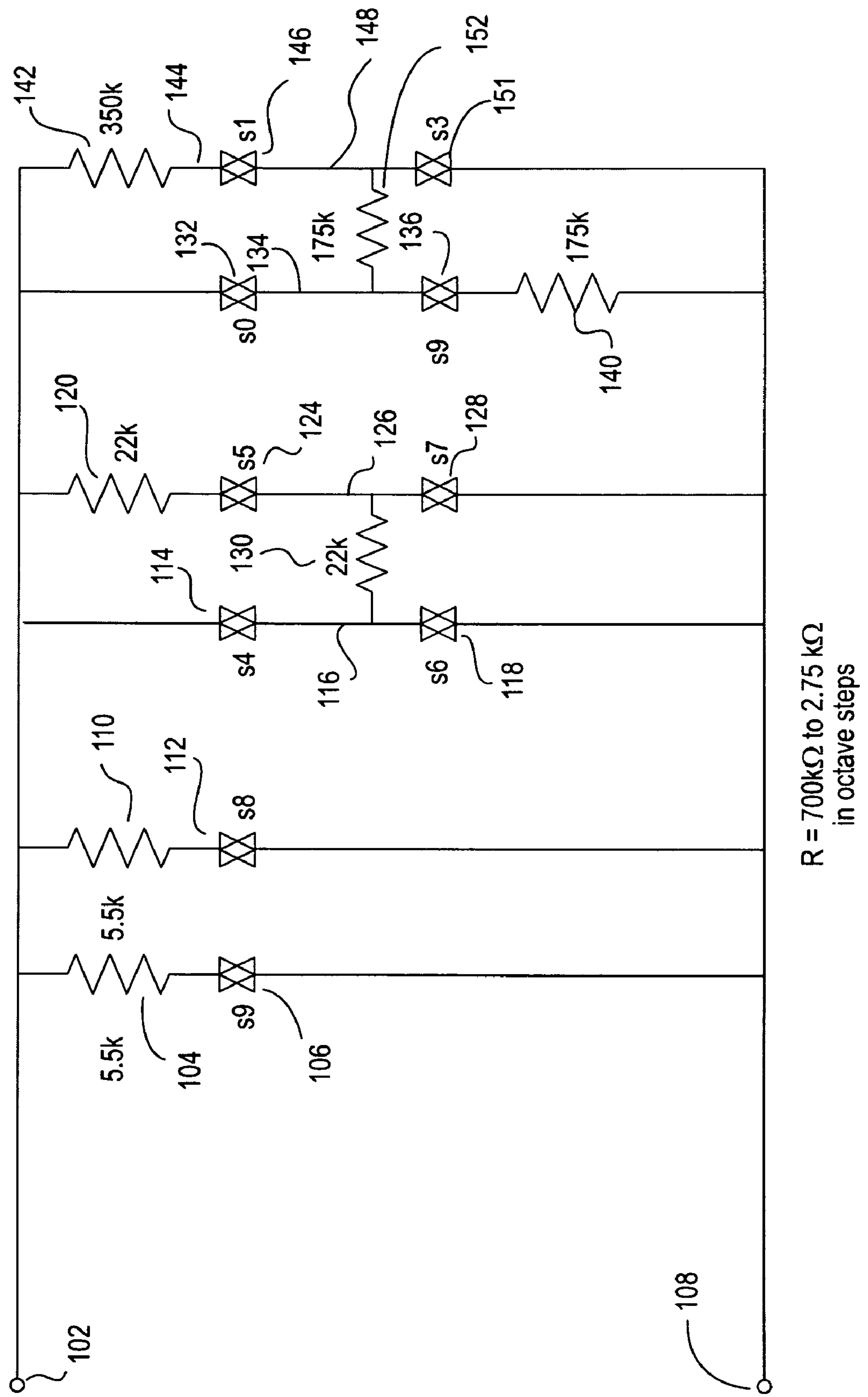
FIG. 6 is a schematic of a tunable resistor embodiment, set forth by way of example and not limitation.

FIG. 6 is a schematic diagram depicting an example tunable resistor which can be used to implement, for example, resistors 62, 70 and 76. In this example, a 5.5 k'Ω resistor 104 is coupled in series with a digital switch 106 ("s9") between the two nodes 102 and 108 of the resistor. In parallel, a 5.5 k'Ω resistor 110 is coupled in series with a digital switch 112 ("s8") between nodes 102 and 108.

A pair of digital switches 114 ("s4") and 118 ("s6") are coupled in series between the nodes 102 and 108. A 22 k'Ω resistor 120, digital switch 124 ("s5"), and digital switch 128 ("s7") are coupled in series between the nodes 102 and 104. A 22 k'Ω resistor is coupled between nodes 116 and 126 between switches 114 and 118 and switches 124 and 128, respectively.

A digital switch 132 ("s0"), a digital switch 136 ("s2") and a 175 k'Ω resistor 140 are coupled in series between the nodes 102 and 108. A 350 k'Ω resistor 142, a switch 146 ("s1") and a switch 151 ("s3") are coupled in series between the nodes 102 and 108. A 175 k'Ω resistor 152 is coupled between nodes 134 and 148 between switches 132 and 136 and switches 146 and 151, respectively.

It will be appreciated that by selectively opening and closing digital switches in the schematic diagram of FIG. 6 that different resistance values can be imposed between nodes 102 and 108. The opening and closing of the digital switches is preferably under program logic control making the resistor "tunable" to a number of discrete resistance values.

FIG. 7 is a table that shows example settings for the switches for the tunable resistor of FIG. 6, and their corresponding electrical characteristics. Persons of skill in the art will appreciate that the settings shown in FIG. 7 can be applied to the various example embodiments disclosed herein. Preferably, the switches of the tunable resistor of FIG. 6 are under control of a digital processor or some other form of logic, such as logic arrays, state machines, etc. By way of non-limiting example, the switches can be under the control of digital processor 24.

Figure 8:
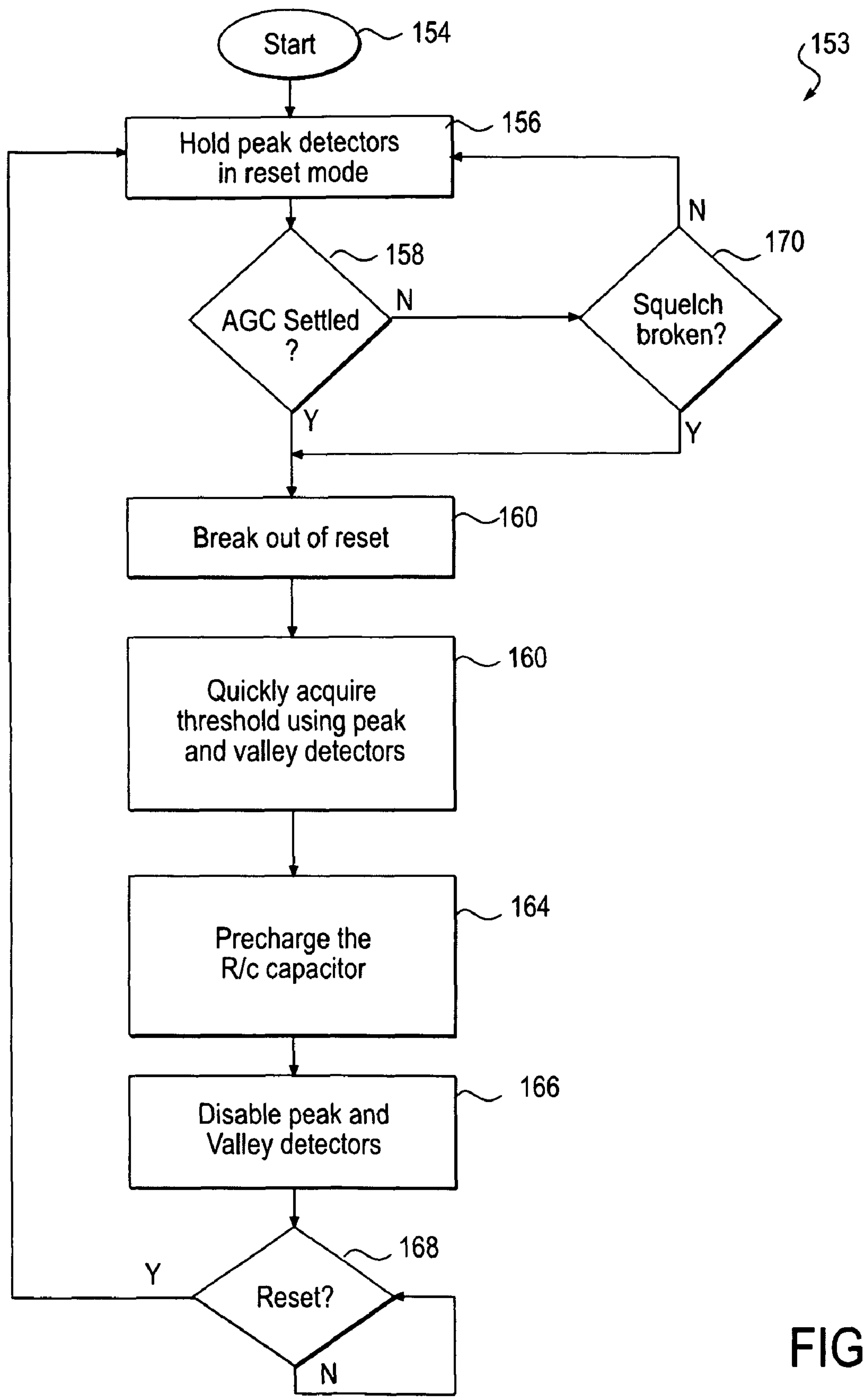
FIG. 8 is a flow diagram, set forth by way of example and not limitation, of a process for controlling the configurable threshold generator embodiment of FIG. 5.

FIG. 8 is a flow diagram depicting an example process embodiment 153. The process embodiment is initiated in an operation 154, and continues in an operation 156 in which peak detectors are held in reset mode. This can be accomplished, for example, by shorting the various capacitors of the circuit to ground or otherwise. Then, in a decision operation 158, a determination is made as to whether the circuit has settled, and if so, the operation continues in an operation 160 which "breaks out" of reset mode. Then, in an operation 162, a threshold is quickly acquired using, in this example, the Peak and Valley Detector Circuit 66. In an embodiment, the acquisition time is programmable.

It will be appreciated by those of skill in the art that the acquisition time of the Peak and Valley Detector Circuit 66 is programmable by, for example, program instructions executing on digital processor 24. Then in an operation 164, the R/C capacitor of, for example, the R/C circuit 60 is precharged. After the R/C capacitor is precharged, the Peak and Valley Detector Circuit 66 is disabled and the R/C Circuit 60 is enabled. This can be accomplished, as will be appreciated by those of skill in the art, by opening and closing digital switches in accordance with programmed logic. Then in a decision loop 168, a determination is made as to whether there is a reset command from, for example, the digital processor 24 and, if so, the operation continues with the reset operation 156.

If in operation 158 it is determined that the circuit has not settled, the operation continues with a decision operation 170 which makes a determination as to whether squelch has been broken. If squelch has been broken, the operation continues with operation 160 and if not, the operation continues with operation 156.

As is well known to those of skill in the art, "squelch" refers to a receiver adjustment whereby the radio is silenced when the input signal level, and therefore the input signal-to-noise ratio (SNR), is below a given level. If the input signal level is greater than this given level, the receiver is said to have "broken squelch" and the SNR is high enough that the receiver can demodulate the input signal reliably.

Although various embodiments have been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part. It is therefore intended that the claims be interpreted in accordance with their true spirit and scope and without limitation or estoppel.

What is claimed is:

1. A data slicer comprising:

a signal input node;

a comparator having a first input of a first polarity, a second input of a second polarity which is the opposite of said first polarity, and an output coupled to a data out node, said first input of said comparator being coupled to said signal input node; and a multi-mode threshold generator including a first threshold generator and second threshold generator, whereby said first threshold generator is selected firstly and said second threshold generator is selected secondly and whereby only one of said first threshold generator and said second threshold generator provides an output to and input of said comparator;

wherein said first threshold generator has a fast attack time and a low signal-to-noise ratio (SNR) and includes a dual peak detector circuit and wherein said second threshold generator has a slow attack time and a high SNR and provides a threshold from an RC circuit and wherein said second threshold generator is charged to an output voltage of said first threshold generator.

2. A data slicer as recited in claim 1 wherein said first polarity is positive and said second polarity is negative.

3. A data slicer as recited in claim 1 wherein said first threshold detector comprises a peak detector having an input coupled to said signal input node and an output coupled to an R/C circuit.

4. A data slicer as recited in claim 3 wherein said peak detector is a maximum peak detector and said R/C circuit is a maximum peak detector R/C circuit and wherein said first threshold detector further includes a minimum peak detector having an input coupled to said signal input node and an output coupled to a minimum peak detector R/C circuit.

5. A data slicer as recited in claim 4 wherein said maximum peak detector R/C circuit and said minimum peak detector R/C circuit are coupled to said second input of said comparator.

6. A data slicer as recited in claim 3 wherein a resistor of said R/C circuit is digitally tunable to various discrete resistances.

7. A data slicer as recited in claim 1 wherein said second threshold generator comprises an R/C circuit having a resistor coupled between said signal input node and said second input of said comparator and a capacitor coupled between said second input of said comparator and ground.

8. A data slicer as recited in claim 7 wherein said resistor is digitally tunable to various discrete resistances.

9. A multi-mode threshold generator comprising:

a first threshold generator having a first attack time after a reset and a first SNR ratio during operation;

a second threshold generator having a second attack time after a reset a second SNR during operation, where said second attack time is greater than said first attack time and said second SNR is greater than said first SNR; and circuitry firstly selecting said first threshold generator and then secondly selecting said second threshold generator, said circuitry further disabling said first threshold generator responsive to enabling said second threshold generator.

10. A multi-mode threshold detector as recited in claim 9 wherein said first threshold detector is a dual peak detector circuit.

11. A multi-mode threshold detector as recited in claim 10 wherein said second threshold detector is an R/C circuit.

12. A multi-mode threshold detector as recited in claim 11 wherein said circuitry includes a plurality of switches.

13. A multi-mode threshold detector as recited in claim 12 wherein at least one resistor of said first threshold detector and said second threshold detector is digitally tunable to a plurality of resistances levels.

14. A multi-mode threshold detector as recited in claim 13 wherein at least one of said plurality of switches and said at least one resistor that is digitally tunable is controlled by a digital processor.

15. A multi-mode threshold detector as recited in claim 14 wherein said digital processor is selected from the group consisting essentially of microcontrollers, microprocessors, discreet logic and state machines.

16. A method for controlling a multi-mode generator comprising:

resetting a first threshold generator and a second threshold generator, the first threshold generator having a fast attack time and the second threshold generator having a slow attack time;

first enabling said first threshold generator for operation after said fast attack time;

second enabling said second threshold generator for operation after said slow attack time;

disabling said first threshold generator after enabling said second threshold generator;

and controlling said multi-mode generator using an output of said second threshold generator as the sole output of said multi-mode generator.

17. A method for controlling a multi-mode generator as recited in claim 16 further comprising pre-charging said second threshold generator prior to enabling said second threshold generator.

* * * * *